US008455985B2

(12) United States Patent
Han et al.

(10) Patent No.: US 8,455,985 B2
(45) Date of Patent: Jun. 4, 2013

(54) INTEGRATED CIRCUIT DEVICES HAVING SELECTIVELY STRENGTHENED COMPOSITE INTERLAYER INSULATION LAYERS AND METHODS OF FABRICATING THE SAME

(75) Inventors: Kyu-hee Han, Hwaseong-si (KR); Sang-hoon Ahn, Hwaseong-si (KR); Eunkee Hong, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 231 days.

(21) Appl. No.: 13/019,520

(22) Filed: Feb. 2, 2011

(65) Prior Publication Data
US 2011/0241184 A1 Oct. 6, 2011

(30) Foreign Application Priority Data
Apr. 1, 2010 (KR) .................. 10-2010-0029972

(51) Int. Cl.
*H01L 29/00* (2006.01)
(52) U.S. Cl.
USPC ..... 257/638; 257/639; 257/640; 257/E29.001
(58) Field of Classification Search
USPC .................. 257/638, 639, 640, E29.001
See application file for complete search history.

(56) References Cited

U.S. PATENT DOCUMENTS

| 2002/0079585 | A1* | 6/2002 | Wong | 257/758 |
| 2002/0132468 | A1* | 9/2002 | Wong | 438/627 |
| 2004/0046199 | A1* | 3/2004 | Wu | 257/301 |
| 2005/0146840 | A1* | 7/2005 | Lee et al. | 361/312 |
| 2010/0230785 | A1* | 9/2010 | Rofougaran | 257/531 |
| 2012/0126258 | A1* | 5/2012 | Lee et al. | 257/88 |

FOREIGN PATENT DOCUMENTS

| JP | 2001-267323 | 9/2001 |
| JP | 2004-296828 | 10/2004 |
| KR | 1020060078661 A | 7/2006 |

* cited by examiner

*Primary Examiner* — Victor A Mandala
(74) *Attorney, Agent, or Firm* — Myers Bigel Sibley & Sajovec, P.A.

(57) ABSTRACT

An integrated circuit device includes a plurality of stacked circuit layers, at least one of the plurality of circuit layers including a composite interlayer insulation layer including laterally adjacent first and second insulating material regions having different mechanical strengths and dielectric properties and a plurality of circuit components disposed in the composite interlayer insulation layer. The first insulating material region may have a lower dielectric constant and a lower mechanical strength than the second insulating material region such that, for example, the first insulating material region may be positioned near signal lines or other circuit features to reduce capacitance while using the second insulating material region near a location that is susceptible to localized mechanical stress, such as a fuse location, an external connection bonding location or a scribe line location.

20 Claims, 15 Drawing Sheets

- Si
- O
- C
- H

- Si
- O
- DOPED O
- C
- H

Si–CH₃ BONDING ↓, Si–OH BONDING ↑

O-Si-O NETWORK ↑

INTEGRATED CIRCUIT DEVICES HAVING SELECTIVELY STRENGTHENED COMPOSITE INTERLAYER INSULATION LAYERS AND METHODS OF FABRICATING THE SAME

CROSS-REFERENCE TO RELATED APPLICATIONS

This application claims the benefit of Korean Patent Application No. 10-2010-0029972, filed on Apr. 1, 2010, in the Korean Intellectual Property Office, the disclosure of which is incorporated herein in its entirety by reference.

BACKGROUND OF THE INVENTION

The inventive subject matter relates to integrated circuit devices and methods of fabricating the same, and more particularly, to integrated circuit devices having interlayer insulation layers and methods of fabricating the same.

To manufacture a semiconductor integrated circuit device, a plurality of various insulation layers, a semiconductor layer, and a conductive layer are formed on a substrate. As design rules for integrated circuits tighten, capacitive coupling occurring between wires narrowly spaced apart is a major obstacle to obtaining a low-power and high-speed integrated circuit. To reduce the capacitive coupling occurring between the wires, for example, a technique of replacing a SiO2 layer (k>3.6) or a SiNx layer (k>5), which is a dielectric material generally used as an inter-wire insulator, with a low dielectric constant (low-k) insulator has been extensively researched.

SUMMARY OF THE INVENTION

Some embodiments of the inventive subject matter provide integrated circuit devices including a plurality of stacked circuit layers, at least one of the plurality of circuit layers including a composite interlayer insulation layer including laterally adjacent first and second insulating material regions having different mechanical strengths and dielectric properties and a plurality of circuit components disposed in the composite interlayer insulation layer. The first insulating material region may have a lower dielectric constant and a lower mechanical strength than the second insulating material region such that, for example, the first insulating material region may be positioned near signal lines or other circuit features to reduce capacitance while using the second insulating material region near a location that is susceptible to localized mechanical stress, such as a fuse location, an external connection bonding location or a scribe line location. For example, the first insulating material region may have a lower dielectric constant and a lower elastic modulus and/or hardness than the second insulating material region.

In some embodiments, the composite interlayer insulation layer includes a continuous insulating material layer and the second insulating material includes a doped region in the continuous insulating material layer. For example, the first and second insulation material regions may be formed from the same SiOCH layer, with the second insulating material region including a portion of the SiOCH region doped with silicon and/or oxygen. In additional embodiments, the first and second material regions include distinct separately-deposited insulating material regions. For example, the first insulating material region may include SiOCH and the second insulating material region may include SiO2, SiON and/or SiN.

In further embodiments, the first insulating material region includes a first silicon oxide material including carbon (C), hydrogen (H) and/or fluorine (F).

In additional embodiments, the first and second insulating material region include respective first and second silicon oxide materials and an oxygen concentration of the second insulating material region is greater than an oxygen concentration of the first insulating material region. In still further embodiments, the first and second insulating material region include respective first and second silicon oxide materials and a silicon concentration of the second insulating material region is greater than a silicon concentration of the first insulating material region.

In some embodiments, a integrated circuit device includes a plurality of stacked circuit layers, at least one of the plurality of circuit layers including a composite interlayer insulation layer including laterally adjacent first and second insulating material regions including respective first and second silicon-containing insulating materials and a plurality of circuit components disposed in the composite interlayer insulation layer, wherein the second silicon-containing insulating material has a greater silicon concentration than the first silicon-containing insulating material. The first insulating material region may have a lower dielectric constant and a lower mechanical strength than the second insulating material region. For example, wherein the first insulating material region may have a lower dielectric constant and a lower elastic modulus and/or hardness than the second insulating material region. The second insulating material region may be positioned proximate a location of the device that is susceptible to a localized mechanical stress.

BRIEF DESCRIPTION OF THE DRAWINGS

Exemplary embodiments of the inventive subject matter will be more clearly understood from the following detailed description taken in conjunction with the accompanying drawings in which.

DETAILED DESCRIPTION

Figure 1:
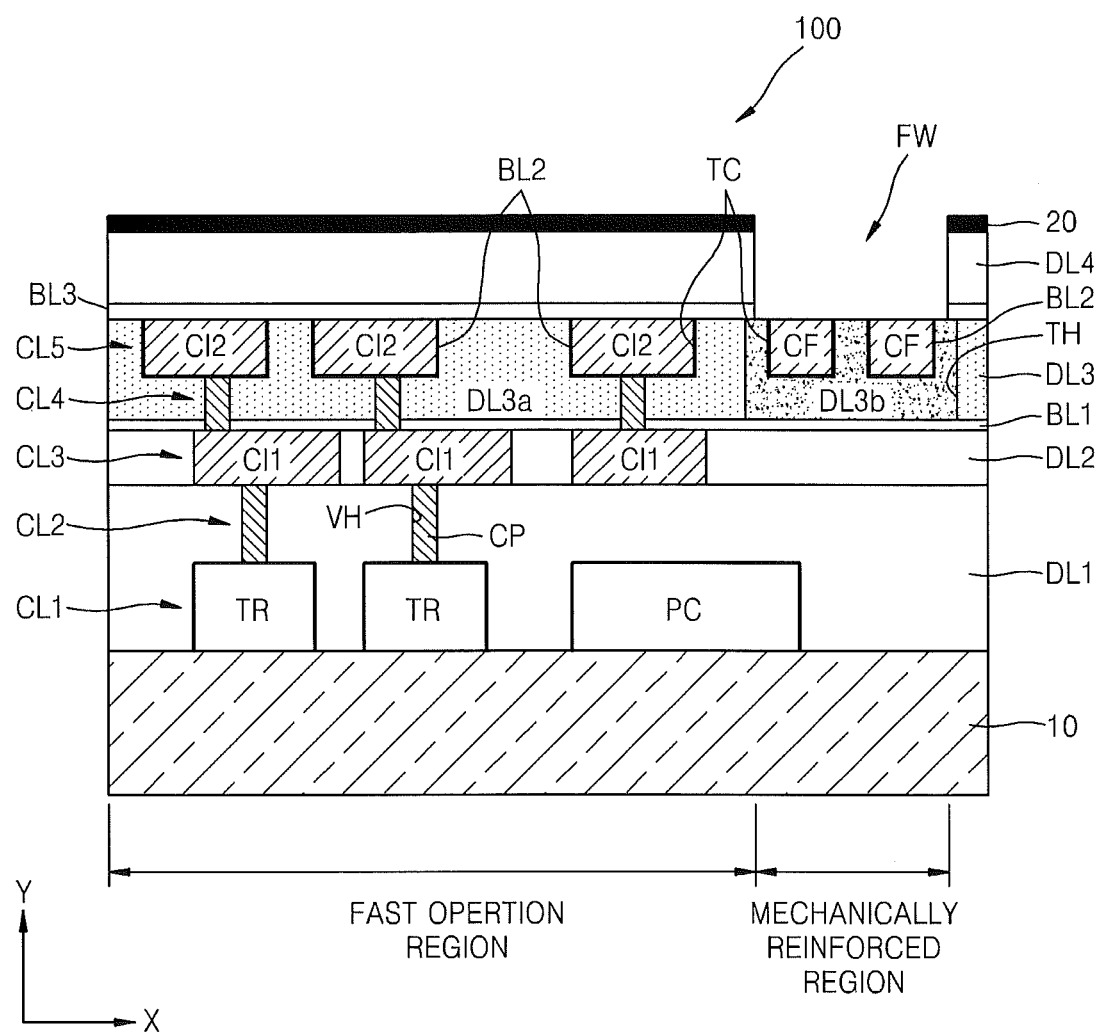
FIG. 1 is a cross-sectional view of a semiconductor chip structure according to some embodiments of the inventive subject matter.

Reference will now be made in detail to exemplary embodiments, examples of which are illustrated in the accompanying drawings. However, exemplary embodiments are not limited to the embodiments illustrated hereinafter, and the embodiments herein are rather introduced to provide easy and complete understanding of the scope and spirit of exemplary embodiments. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may include deviations in shapes that result, for example, from manufacturing. For example, an implanted region illustrated as a rectangle may, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view of a semiconductor chip structure 100 for an integrated circuit device according to some embodiments of the inventive subject matter.

Referring to FIG. 1, an integrated circuit (semiconductor chip) structure 100 includes a plurality of circuit layers CL1, CL2, CL3, CL4, and CL5 that form a multi-layered structure by being stacked in a vertical direction Y with respect to a main surface of a substrate 10, between the substrate 10 and a passivation layer 20. The substrate 10 may be, for example, a silicon substrate, but the inventive subject matter is not limited thereto. For example, the substrate 10 may be a silicon-on-insulator substrate, a strained silicon substrate, a silicon-germanium alloy substrate, a germanium substrate, or a combination of two or more of these substrates, for example, a strained silicon-on-insulator substrate, for improving the charge mobility of a silicon substrate or reducing a bulk effect of a substrate. Alternatively, the substrate 10 may be a suitable Group III-V compound substrate such as GaAs. The passivation layer 20 for protecting an uppermost surface of the semiconductor chip structure 100 may include an inorganic thin layer, such as a silicon oxide layer or a silicon nitride layer or an organic thin layer such as polyimide.

Each of the circuit layers CL1, CL2, CL3, CL4 and CL5 includes circuit components. The circuit components may be microprocessors, logic devices, digital signal processing devices, or memory devices. Alternatively, the circuit components may be circuit components for achieving the multiple functions of the above-stated devices. For example, the circuit components may be access devices TR, such as transistors, and passive devices PC, such as capacitive components for storing information or resistive components having a resistance of, for example $1\Omega$ or greater. However, the inventive subject matter is not limited thereto.

The circuit components may also be contact plugs (also known as vias) CP for electrically connecting circuit components belonging to different circuit layers to one another, conductive lines CI1 and CI2, such as bus lines, word lines, and logic wire lines, for electrically connecting circuit components belonging to a same circuit layer to one another, and conductive fuses CF for activating a redundancy cell in preparation for a predetermined defective circuit member or changing the constructions of circuits in order to achieve a desired function.

The above-stated circuit components are only examples, and the inventive subject matter is not limited thereto. For example, the circuit components may include magnetic components for storing information or pad patterns (which will be described later) for connection with an external circuit.

The above-stated circuit components may be electrically insulated from one another by one or more insulation structures. The insulation structures may include an interlayer insulation layer DL1 for electrically insulating the circuit components of, for example, two of the plurality of circuit layers, for example, the circuit components TR and PC belonging to the circuit layer CL1 and the conductive lines CI1 belonging to the circuit layer CL3, from each another. The insulation structures may also include another interlayer insulation layer, for example, an interlayer insulation layer DL3 for electrically insulating the conductive lines CI1 and CI2 belonging to the circuit layers CL3 and CL5, respectively, from each other.

The insulation structures may also include an interlayer insulation layer DL2 disposed between the conductive lines CI1 in order to electrically insulate the circuit components belonging to an identical circuit layer, for example, the conductive lines CI1 of the circuit layer CL3. The insulation structures may also include an interlayer insulation layer DL4 disposed on the conductive lines CI2 and the conductive fuses CF in order to cover the conductive lines CI2 and the conductive fuse CF.

In order to form the contact plugs CP for electrically connecting the circuit components TR and PC existing below the contact plugs CP to the conductive lines CI1 positioned above the contact plugs CP, some of the interlayer insulation layers DL1-DL4 may include, like the interlayer insulation layer DL1, via holes VH that expose the circuit components TR and PC existing below the contact plugs CP. The interlayer insulation layers DL1-DL4 may also include, like the interlayer insulation layer DL3, trenches TC in which wiring patterns with a damascene structure, for example, the conductive lines CI2 and the conductive fuses CF, are buried.

The interlayer insulation layers DL1-DL4 may also include, like the interlayer insulation layer DL4, at least one fuse window FW through which the conductive fuses CF are exposed in order to perform a repair process which will be described later. As such, the interlayer insulation layers DL1-DL4 may undergo a suitable process for forming the via holes VH, the trenches TC or the fuse windows FW, after being formed to arrange the circuit components.

Although 5 circuit layers and 4 insulation structures disposed therebetween are illustrated in the embodiments illustrated in FIG. 1, six or more circuit layers may be formed on the substrate. The upper surface of an interlayer insulation layer may be flat across the substrate or may be stepped due to different heights and different pattern densities of the circuit components.

Some of the interlayer insulation layers DL1-DL4, for example, the interlayer insulation layer DL3, may be a composite insulation layer having a first insulation layer DL3a having a low dielectric constant and a second insulation layer DL3b more mechanically strengthened than the first insulation layer DL3a, where needed. The first and second insulation layers DL3a and DL3b in the composite insulation layer are disposed adjacent to each other and on the same level.

The first insulation layer DL3a may include a low dielectric constant (low-k) insulation layer having a smaller dielectric constant than a $SiO_2$ layer (k>3.6), which is a commonly used dielectric material. The low dielectric constant insulation layer may be, for example, a silicon-based insulation layer, a porous silicon oxide layer, or a polymer insulation layer including carbon (C), hydrogen (H), fluorine (F), or a combination of two or more of these materials. The low dielectric constant insulation layer may be, for example, a silicon-based insulation layer including carbon (C), hydrogen (H), fluorine (F), or a combination of two or more of these materials.

The low dielectric constant insulation layer may be a SiOCH layer. A SiOCH layer has a low dielectric constant k of 3 or less and has a fine structure that can improve mechanical characteristics. These advantages of an SiOCH layer will be clearly understood from a method of fabricating a semiconductor chip structure, which will be described later.

Within the semiconductor chip structure 100, since the first insulation layer DL3a having a low dielectric constant can reduce delay of signal transmission by reducing capacitive coupling due to a reduced distance between the circuit components, the first insulation layer DL3a may be used in a region for which high-speed operation is desired, for example, a "fast operation region" in which the conductive lines CL2, such as bus lines, bit lines, word lines, and logic wiring lines, are arranged.

The second insulation layer DL3b is mechanically strengthened in comparison to the first insulation layer DL3a, for example, has a greater hardness and/or a greater elastic modulus. The second insulation layer DL3b may include, for example, a $SiO_2$, SiON, or SiN layer. The second insulation layer DL3b may be selectively used in a region where a mechanical and/or thermal stress concentrates in the fabrication of the semiconductor device. In other words, the second insulation layer DL3b may be applied to a region that requires mechanical strength (the mechanically strengthened region of FIG. 1) within the semiconductor chip structure 100. For example, when a first insulation layer having weak mechanical characteristics is used, the second insulation layer DL3b may be applied to a region where defects such as cracks, breakages, or detachment from an adjacent layer are generated during the fabrication of the semiconductor device, that is, to a back-end-of-line (BEOL). Such mechanically strengthened regions may be used on a wafer level or a chip level.

In FIG. 1, a region requiring mechanical strength may be a region where the conductive fuses CF are formed, and the second insulation layer DL3b is selectively disposed in the region requiring mechanical strength so as to define the mechanically strengthened region. The conductive fuses CF are formed in the second insulation layer DL3b corresponding to the mechanically strengthened region.

In some embodiments of the inventive subject matter, the conductive fuses CF may have, as illustrated in FIG. 1, a damascene structure buried in the trenches TC of the second insulation layer DL3b. Likewise, the conductive lines CI2 in the first insulation layer DL3a may have a damascene structure. In this case, the conductive fuses CF in the second insulation layer DL3b and the conductive lines CI2 in the first insulation layer DL3a may be simultaneously formed, so that a process of forming the conductive fuses CF may be simplified. Although not shown, the conductive lines CL1 below the first insulation layer DL3a may also have a damascene structure. In this case, the conductive lines CL1 below the first insulation layer DL3a may be buried in the trenches formed in the interlayer insulation layer DL2.

The conductive lines CI2 and the conductive fuses CF each having the above-described damascene structure may include copper or copper alloy. As is well known in the art, the damascene structure of the copper or copper alloy may be formed by electrochemical deposition such as nonelectrolytic plating, electroplating, or the like. The conductive lines of copper or copper alloy may have sheet resistance equal to that of conventional aluminum (Al) wiring although the thickness of the copper or copper alloy conductive lines is decreased to be three or more times less than that of the conventional aluminum wiring. Accordingly, when the copper or copper alloy conductive lines are used in the fast operation region, power consumption and an operational temperature may be reduced. A wiring structure using the copper damascene conductive lines C12 and the first insulation layer DL3a having a low dielectric constant reduces or suppresses RC delay, thereby securing a fast operation region within the semiconductor chip structure 100.

In some embodiments of the inventive subject matter, a buffer layer BL1 functioning as a copper diffusion prevention layer or an etch prevention layer for preventing the first insulation layer DL3a from being degraded due to the diffusion of copper into the first insulation layer DL3a may be provided between the interlayer insulation layer DL3 having the above-described composite structure and the conductive lines CI1 having the damascene structure of copper and copper alloy, which are formed below the interlayer insulation layer DL3. The first buffer layer BL1 may be, for example, a SiCN layer.

In some embodiments of the inventive subject matter, a buffer layer BL2 for preventing copper diffusion may be formed between inner walls of the trenches TC of the first insulation layer DL3a and the conductive lines CI2 having the damascene structure. Likewise, the buffer layer BL2 may also be formed between inner walls of the trenches TC of the second insulation layer DL3b and the fuse lines CF having a damascene structure. The buffer layer BL2 formed on the inner walls of the trenches TC may include a conductive layer such as a Ta layer, a TaN layer, a Ti layer, a TiN layer, a W layer, or a WN layer. However, the buffer layer BL2 may reduce the effect of copper wiring because it has a greater resistance than copper. In other embodiments of the inventive subject matter, the buffer layer BL2 may be formed of an insulation layer such as SiCN. In some embodiments of the inventive subject matter, a buffer layer BL3 such as silicon nitride may be formed on the conductive lines CI2 having a damascene structure in order to prevent copper diffusion.

Although the conductive lines CI1 and CI2 have a damascene structure in the embodiments of FIG. 1, a dual damascene structure may be used in some embodiments of the inventive subject matter. In this case, as is well known in the art, the conductive lines CI1 and CI2 may be formed simultaneously with corresponding contact plugs CP by chemical vapor deposition (CVD) having excellent gap-filling characteristics, plasma enhanced CVD (PECVD), or the like.

After the conductive fuses CF are formed, when a subsequent process of forming an insulation layer (not shown) for protecting the conductive fuses CF is completed, a semiconductor device may conduct a repair process of replacing a cell region determined as a defect through a defect-determining test with a redundancy cell. The connection state of the conductive fuses CF may be changed to alter the configuration of circuits in order to achieve a desired function. Typically, the repair process may be performed by projecting a laser beam onto some of the conductive fuses CF exposed through the fuse windows FW and blowing away the exposed conductive fuses CF.

Figure 2A:
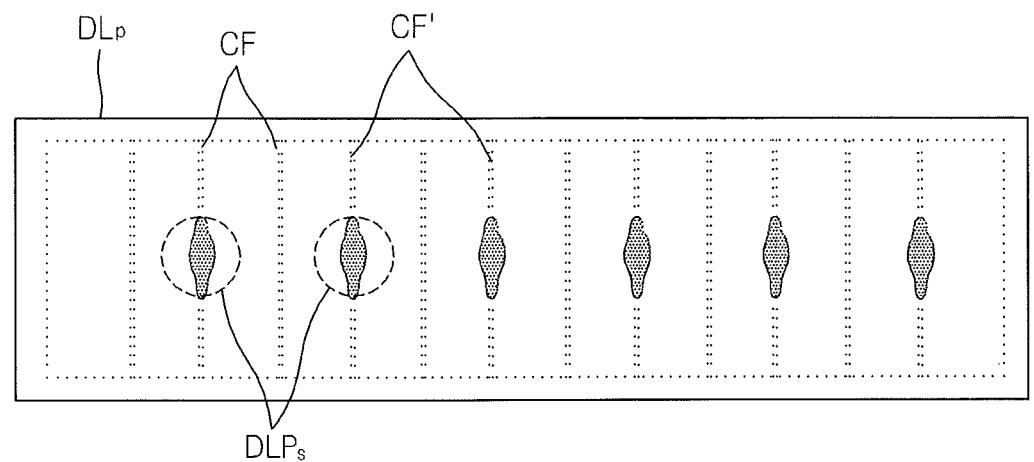
FIG. 2A is a picture of an upper portion of a semiconductor chip structure, which shows a result of a repair process performed after conductive fuses are formed within trenches of a mechanically strengthened insulation layer, according to some embodiments of the inventive subject matter.
Figure 2B:
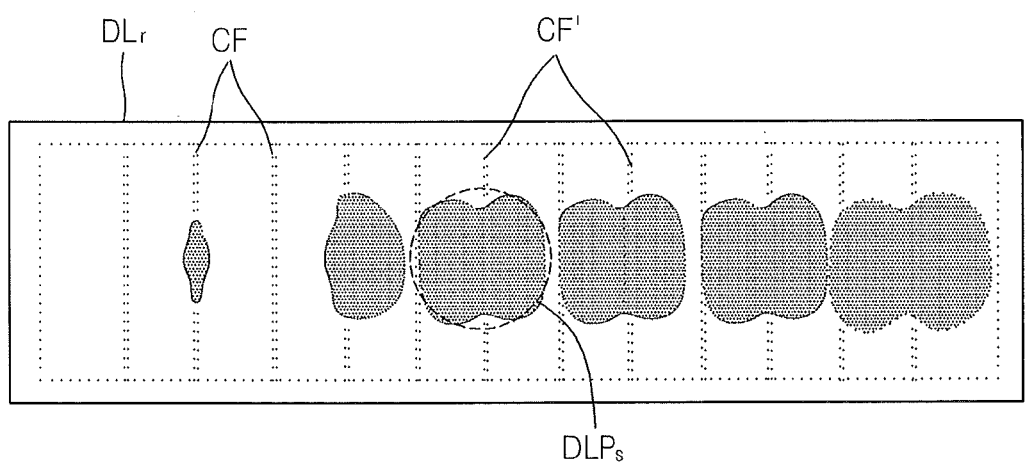
FIG. 2B is a picture of an upper portion of a semiconductor chip structure, which shows a result of a repair process performed after conductive fuses are formed within trenches of a SiOCH layer, which is a low dielectric constant layer, according to a comparative example.

FIG. 2A is a picture of an upper portion of a semiconductor chip structure, which shows a result of a repair process performed after conductive fuses CF are formed within the trenches of a mechanically strengthened insulation layer $DL_P$ according to some embodiments of the inventive subject matter. FIG. 2B is a picture of an upper portion of a semiconductor chip structure, which shows a result of a repair process performed after the conductive fuses CF are formed within the trenches of a SiOCH layer $DL_T$, which is a low dielectric constant layer, according to a comparative example. FIG. 2A illustrates a case where a laser blowing process has been performed twice with lasers having energies of 0.8 μJ and 0.16 μJ, and FIG. 2B illustrates a case where a laser blowing process has been performed once with a laser having an energy of 0.16 μJ.

Referring to FIG. 2A, although the laser blowing process was performed twice in order to cut some CF' of the conductive fuses CF, regions $DLP_S$ of the second insulation layer $DL_P$, which are below the laser-blown conductive fuses CF', did not collapse. However, referring to FIG. 2B, regions $DLP_S$ of the SiOCH layer $DL_T$, which are below the laser-blown conductive fuses CF', collapsed. According to the picture of FIG. 2B, this collapse extended up to regions below different conductive fuses that are adjacent to the laser-blown conductive fuses CF' and not subjected to the laser blowing process.

As such, the second insulation layer $DL_p$ according to some embodiments of the inventive subject matter has greater resistance to thermal stress such as laser blowing and enables a reliable repair process to be performed. Referring back to FIG. 1, since the mechanically strengthened second insulation layer DL3b is used only in the region below the conductive fuses CF and the first insulation layer DL3a having a low dielectric constant is used in the other fast operation region, the semiconductor chip structure 100 securing a fast (i.e., high speed) operation and having high resistance to a thermal and/or mechanical stress in a process during semiconductor chip fabrication, such as a repair process, may be obtained.

Figure 3:
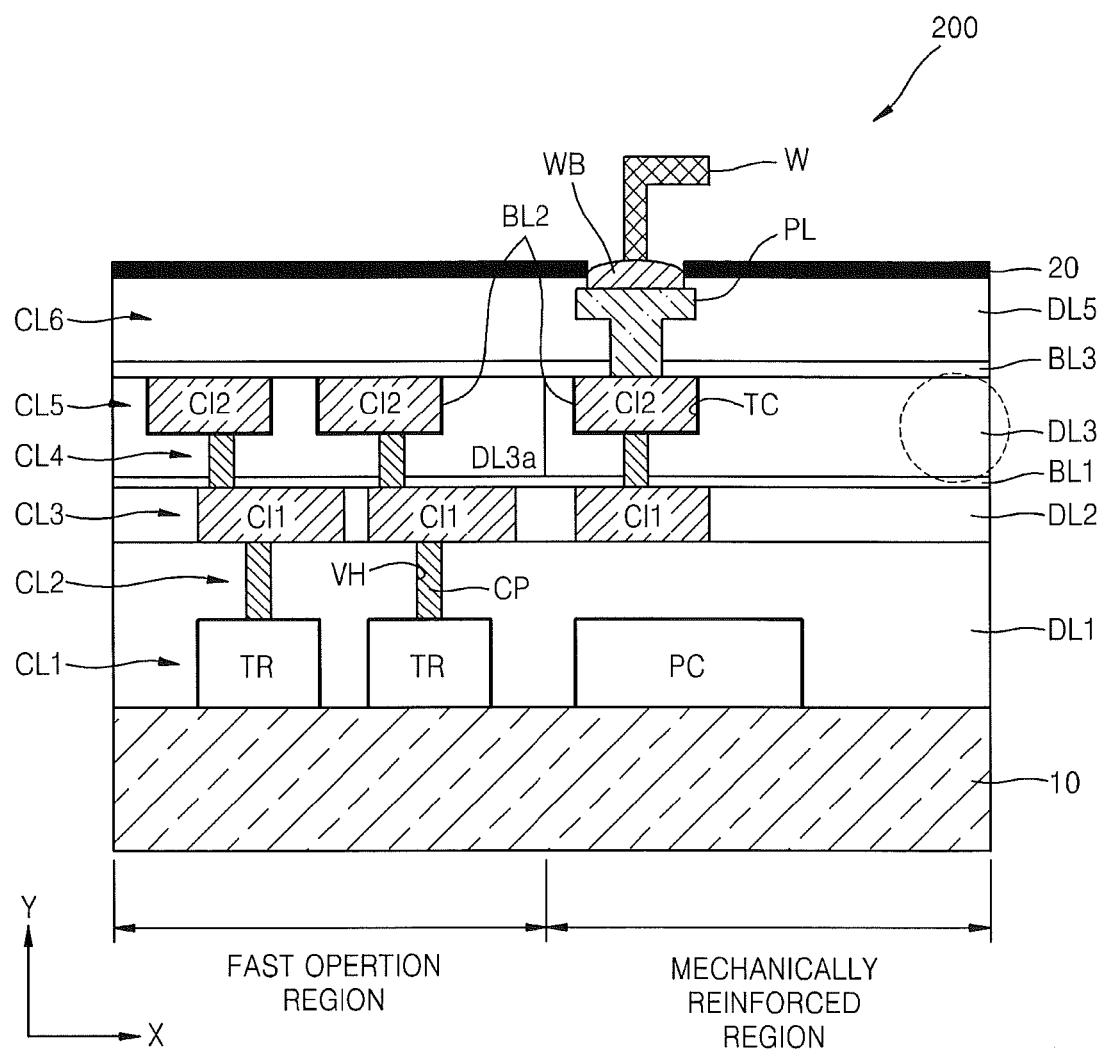
FIG. 3 is a cross-sectional view of a semiconductor chip structure according to another embodiment of the inventive subject matter.

FIG. 3 is a cross-sectional view of a semiconductor chip structure 200 according to another embodiment of the inventive subject matter. Hereinafter, components having the same reference symbols as those shown in FIG. 1 from among the components shown in FIG. 3 may refer to the description about FIG. 1 unless otherwise stated.

Referring to FIG. 3, the semiconductor chip structure 200 may include, between a substrate 10 and a passivation layer 20, a plurality of circuit layers CL1 through CL6 that form a multi-layered structure by being stacked in a vertical direction Y with respect to a main surface of the substrate 10.

The circuit layer CL6 may include at least one conductive pad PL for electrical connection with an external circuit (not shown), for example, another semiconductor chip or a lead of a lead frame. The conductive pads PL may be formed of Al, copper, or an alloy of these materials. The conductive pads PL are electrically insulated from the conductive lines CI2 by an interlayer insulation layer DL5.

The conductive pads PL may be electrically connected to the external circuit by, for example, wire bonding or bumps. As is well known in the art, in the wire bonding, one end of a wire W is bonded to the conductive pads PL by a wire ball WB and then the other end of the wire W is bonded to the external circuit, by using a capillary (not shown). The wire ball WB is pressurized by application of ultrasonic and thermal energies so as to be bonded to the conductive pads PL, and low-resistance contacts are formed on the conductive pads PL.

The ultrasonic and thermal energies may be concentrated on the conductive pads PL during the wire bonding, and may be transmitted to structures below the conductive pads PL, for example, the conductive lines CI2 and the interlayer insulation layer DL3 for insulating the conductive lines CI2, via the conductive pads PL.

In the embodiments of FIG. 3, the mechanically strengthened second insulation layer DL3b that defines a mechanically strengthened region is disposed only below the conductive pads PL. The ultrasonic and thermal energies transmitted along the conductive pads PL are absorbed into the mechanically strengthened region and thus prevent the first insulation layer DL3a adjacent to the mechanically strengthened region from being damaged. Thus, yield reduction due to the wire bonding may be lessened.

It has been observed that, when a copper damascene wiring structure is used as the conductive lines CI2 and a low dielectric constant SiOCH layer is used as the interlayer insulation layer DL3, an SiN layer being the buffer layer BL3 for preventing copper diffusion and the SiOCH layer were separated from each other due to a shear stress accumulated therebetween. In particular, due to a localized stress applied during wire bonding, separation frequently occurs between the buffer layer BL3 and the SiOCH layer, because the SiOCH layer has a larger interface energy and a weaker mechanical strength with respect to the SiN layer (that is, the buffer layer BL3) than a conventional $SiO_2$ layer.

Accordingly, within the semiconductor chip structure 200, a region below the conductive pads PL to which a localized stress is applied during wire bonding may be compensated for by locally increasing mechanical strength. For example, a locally strengthened region may be formed by forming the strengthened second insulation layer DL3b.

Although wire bonding is illustrated in the embodiments of FIG. 3, conductive bumps may be formed on the conductive pads PL in order to achieve connection with the external circuit. Even in this case, localized stress may be applied, and the resistance of the semiconductor chip structure with respect to the stress generated during the formation of the conductive bumps may be increased due to the use of the strengthened second insulation layer DL3b.

During individualization (dicing) of a semiconductor chip, an edge portion (that is, a region encircled by a dotted line of FIG. 3) of the semiconductor chip structure 200 by which a scribe line passes may also be subject to a mechanical and/or thermal stress by a blade or a laser. To achieve fast operation, if the interlayer insulation layer DL3 for insulating wiring structures, namely, the conductive lines CI2, is formed of a low dielectric constant insulation layer, cracks may penetrate from an edge of the semiconductor chip structure toward the inside thereof or adjacent different buffer layers, namely, the buffer layers BL1 and BL3, may be separated from each other, on a level where the low dielectric constant insulation layer susceptible to the mechanical and/or thermal stress during the individualization is formed. However, in some embodiments of the inventive subject matter, a mechanical strengthening second insulation layer DL3b is formed in the edge portion of the semiconductor chip structure 200 near the scribe line, so that a semiconductor chip structure resistant to damage from individualization may be obtained.

If the conductive pads PL are formed around the edge of an upper portion of the semiconductor chip structure 200, the mechanically strengthened second insulation layer DL3b may be formed from a region below the conductive pads PL to the edge of the semiconductor chip structure 200 without discontinuity, as shown in the embodiments of FIG. 3.

The above-described semiconductor chip structures may secure fast operation in a region where the conductive lines CL2 are formed and also may be mechanically strengthened to be resistant to thermal and/or mechanical stress locally applied during the manufacture of the semiconductor chip structures on both a wafer level or a chip level, by using the interlayer insulation layer DL3 having a composite structure including the first insulation layer DL3a having a low dielectric constant and the mechanically strengthened second insulation layer DL3b. The composite interlayer insulation layer DL3 may suppress or reduce separation generated on an interface between the buffer layers BL1 and BL3 adjacent to the first insulation layer DL3a, thereby improving electrical and mechanical reliabilities of the semiconductor chip structures.

The composite interlayer insulation layer DL3 within the above-described semiconductor chip structures 100 and 200 may define a plurality of mechanically strengthened regions on a single insulation layer level. For example, in FIG. 3, separate mechanically strengthened regions may be defined in a region below the conductive pads PL and in a scribe line region, respectively. In addition, in the semiconductor chip structures 100 and 200, composite interlayer insulation layers may be used on a plurality of levels. For example, if the region below the conductive pads PL and the region below the conductive fuses CF are on different levels, separate composite insulation layer structures may be formed on the different levels, respectively.

Figure 4A:
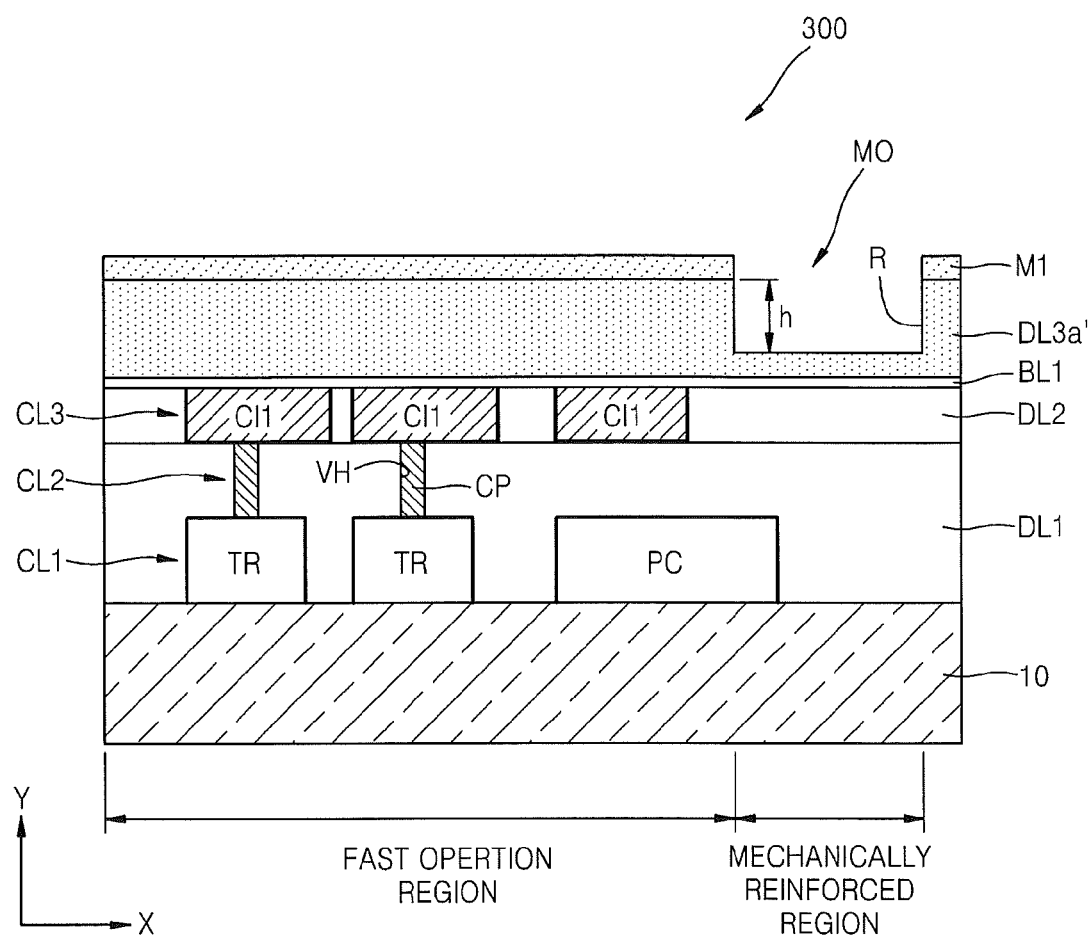
FIGS. 4A through 4C are cross-sectional views illustrating a method of fabricating a composite insulation layer of a semiconductor chip structure, according to some embodiments of the inventive subject matter.
Figure 4B:
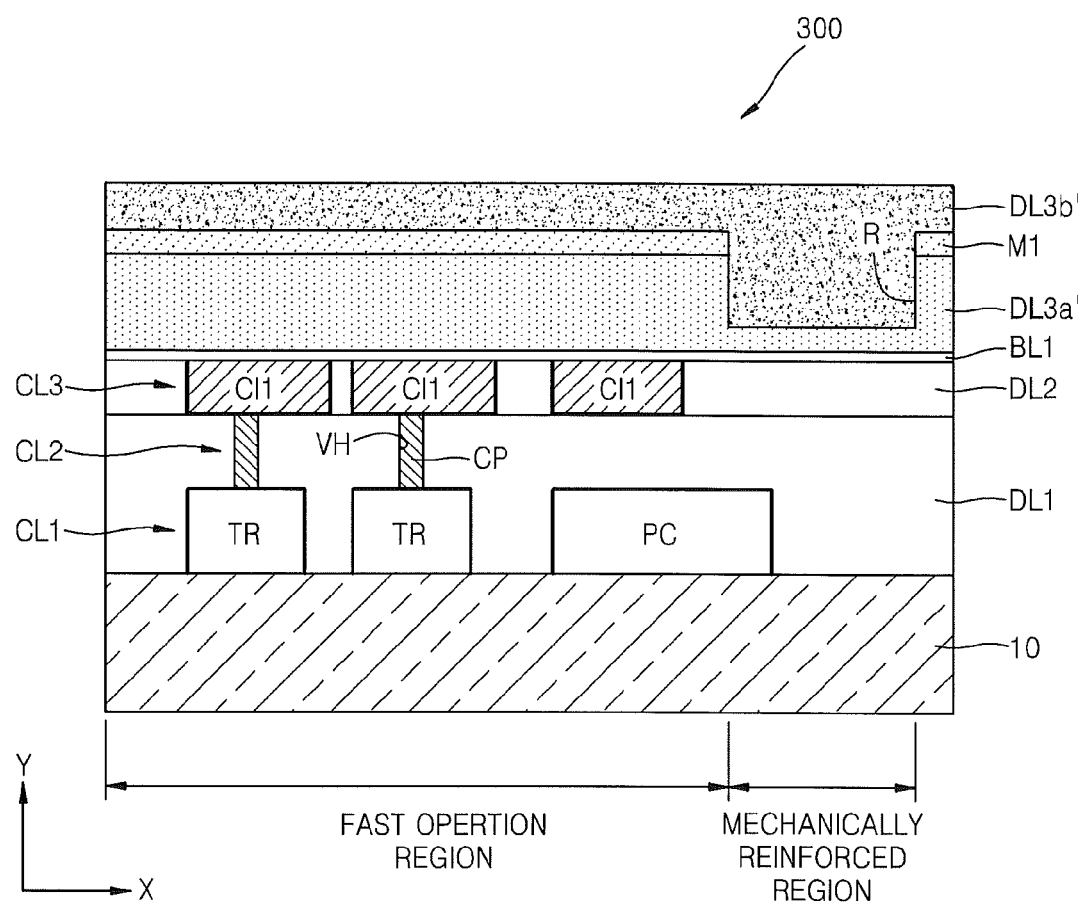
Figure 4C:
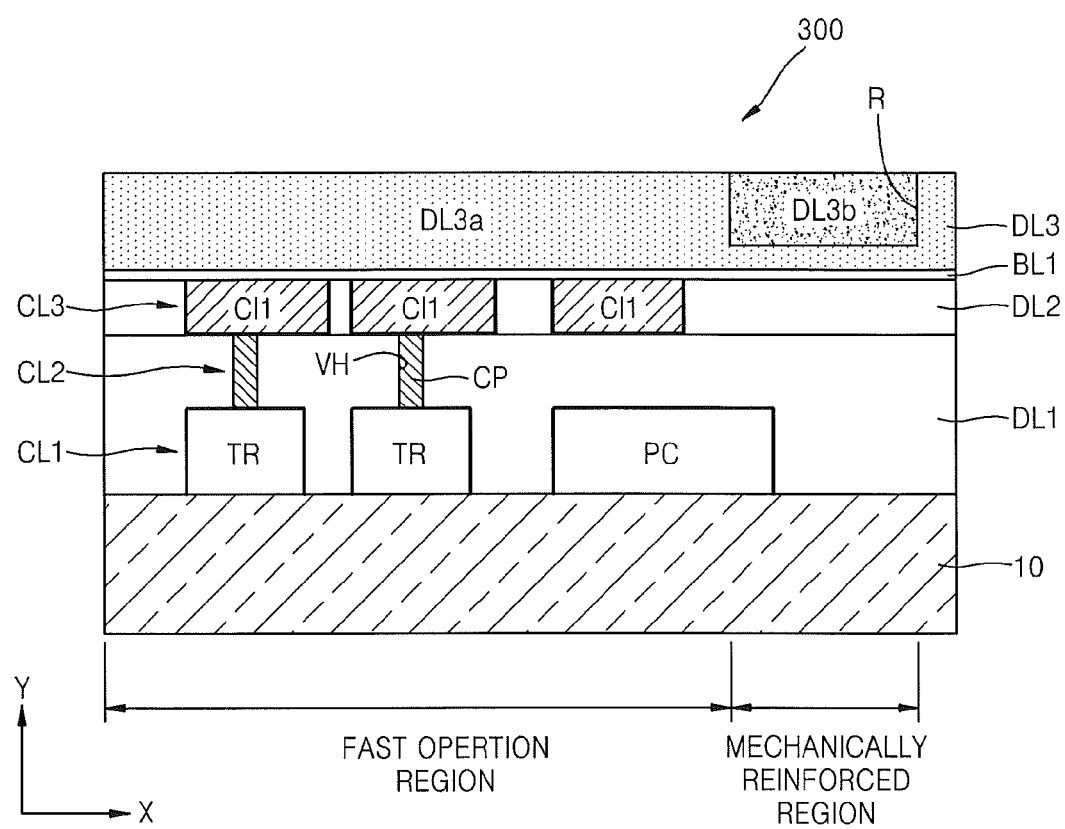

FIGS. 4A through 4C are cross-sectional views illustrating operations for fabricating a composite insulation layer of a semiconductor chip structure 300 according to some embodiments of the inventive subject matter. Hereinafter, components having the same reference symbols as those shown in FIGS. 1 through 3 from among the components shown in FIGS. 4A through 4C may refer to the description about FIGS. 1 through 3 unless otherwise stated.

Referring to FIG. 4A, for example, a lower structure including a plurality of circuit layers CL1, CL2, and CL3 and interlayer insulation layers DL1 and DL2 for insulating the circuit layers CL1, CL2, and CL3 from one another is formed on a substrate 10. A first insulation layer DL3a' having a low dielectric constant is formed on the lower structure. The first insulation layer DL3a' may be, for example, a silicon-based insulation layer, a porous silicon oxide layer, or a polymer insulation layer, each including carbon (C), hydrogen (H), fluorine (F), or a combination of two or more of these materials. The first insulation layer DL3a' having a low dielectric constant may be, for example, a silicon-based insulation layer including carbon (C), hydrogen (H), fluorine (F), or a combination of two or more of these materials, for example, a SiOF layer, a SiOF layer, or a SiOCH layer. The first insulation layer DL3a' having a low dielectric constant may be a SiOCH layer.

A SiOCH layer may be formed by PECVD at a temperature in the range from about 200° C. to about 450° C. using a gas mixture of trimethylsilane (as a precursor) and oxygen. By controlling a substrate temperature, which is a process parameter, a fine structure characteristic, such as the porosity of the SiOCH layer, and/or a composition ratio, such as the content of C may be changed, and thus a dielectric constant may be controlled. Stated processes used to form a first insulation layer are just examples, and the inventive subject matter is not limited thereto. However, for example, the SiOCH layer may be formed by flowable chemical vapor deposition (FCVD). FCVD is described in a thesis of Sanghoon An et al. entitled "Flowable CVD low k (k=2.8) C-doped oxide for Inter-metallic dielectrics (IMD) application with 30 nm level line/ spacing," the contents of which are incorporated by reference herein in its entirety. FCVD may obtain a layer having excellent gap-filling characteristics by inducing condensation of a response species through low-temperature deposition, and will be described later with reference to FIG. 4B.

Thereafter, a mask pattern M1, such as a photoresist layer or a $SiO_2$ layer, having an opening MO that defines a mechanically strengthened region is formed on the first insulation layer DL3a'. An exposed portion of the first insulation layer DL3a' is etched by a predetermined depth h in a dry or wet etching process using the mask pattern M1, to thereby form a recess R. Alternatively, the first insulation layer DL3a' may be etched as much as its thickness to thereby form a through hole (not shown) by using the buffer layer BL1 as an etch stop layer (see the through hole TH of FIG. 1).

Referring to FIG. 4B, a second insulation layer DL3b' mechanically strengthened in comparison to the first insulation layer DL3a' is formed to fill the through hole TH of FIG. 1 or the recess R. The second insulation layer DL3b' may be formed by an insulation layer formation process that is well known in the art, for example, CVD, PECVD, high-density plasma CVD, or a sol-gel technique.

The second insulation layer DL3b' may be, for example, an $SiO_2$, SiON, or SiN layer having excellent mechanical characteristics, but the inventive subject matter is not limited thereto. For example, the second insulation layer DL3b' may be an insulation layer including the same element as that included in the first insulation layer DL3a', for example, the SiOCH layer, may have layer characteristics that can be controlled according to a substrate temperature or a chamber pressure, and be deposited by the FCVD, which provides excellent gap-filling characteristics.

A technique for fabricating the second insulation layer DL3b' by FCVD includes a process of flowing a precursor having silicon and carbon, which form an easily-condensable intermediate species such as siloxane and/or silicon alkoxide, with a suitable oxidizer, such as $O_2$, onto the substrate 10, for example, at a substrate temperature of less than about 100° C. and under a chamber pressure of less than about 10 Torr. The intermediate species may be, for example, $SiOR_{n-x}$—$(OH)_x$ molecules or $SiOR_{n-x}$—$(OH)_x$ molecules, and may be relatively easily condensed on the surface of the first insulation layer DL3a' and flow into the recess R.

$SiO$—$R_n$ (where R is a hydrocarbon group) of the siloxane precursor forms intermediate species easily condensable on a substrate while undergoing a hydrolysis reaction under the presence of an oxidizer, and it has been observed that the value n of the $SiOR_{n-x}$—$(OH)_x$ molecules increases as the flow rate of the siloxane precursor with respect to the flow rate of the oxidizer increases, and thus the mobility of the intermediate species increases. The increase in mobility leads to an improvement of the gap-filling characteristics, and thus the second insulation layer DL3b' may be relatively easily formed with respect to a pattern having a large aspect ratio without defects, such as seams.

Then, planarization, such as chemical mechanical polishing (CMP) or an etch back process, is performed until the surface of the first insulation layer DL3a' is exposed, thereby removing a portion of the second insulation layer DL3b'. The mask pattern M1 may also be removed. Thus, as illustrated in FIG. 4C, the composite insulation layer, namely, an composite interlayer insulation layer DL3 including a first insulation layer DL3a defining a fast operation region, and a second insulation layer DL3b defining a mechanical strengthened region on the same level may be provided. Although the second insulation layer DL3b' is formed without removing the mask pattern M1 in the shown embodiment, the second insulation layer DL3b' may be formed to fill the recess R or the through hole TH of FIG. 1 in the first insulation layer DL3a', after removing the mask pattern M1.

Next, impurities included in the second insulation layer DL3b may be volatilized out or an O—Si—O network density may be increased by hardening the second insulation layer DL3b thermally or with UV at a temperature in the range from about 350° C. to about 550° C., thereby increasing the mechanical strength of the semiconductor chip structure 300. Alternatively, as illustrated in FIG. 6E, the mask pattern M1 may not be removed so as to be used as a mask for thermal or UV annealing. This will be described later with reference to further embodiments.

In fabricating a composite insulation layer by using a SiOCH layer formed by FCVD and thermal or UV annealing with respect to the SiOCH layer, excellent gap-filling characteristics may be provided and mechanical strength may be secured. Such a technique is anticipated to be advantageous for semiconductor devices having a design rule that dictates an interwire pitch less than 30 nm.

As described above with reference to FIGS. 1 and 3, the conductive lines CI2, the conductive fuses CF, and the interlayer insulation layer DL4 or the passivation layer 20 for insulating the conductive lines CI2 and the conductive fuses CF may be formed to thereby complete the formation of the semiconductor chip structure 300.

Figure 5:
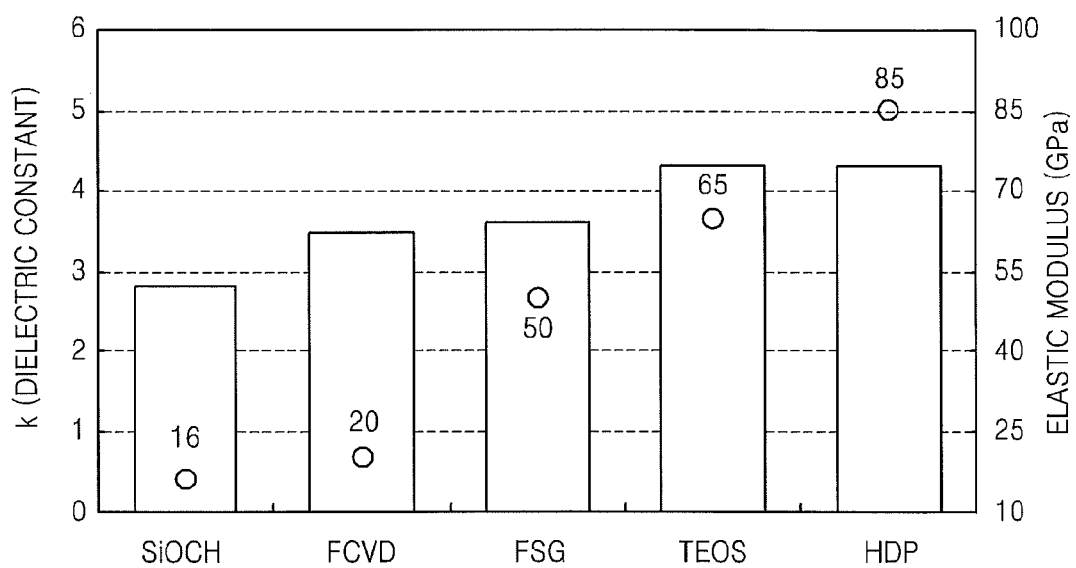
FIG. 5 is a graph showing dielectric constants and elastic moduli of a flowable chemical vapor deposition (FCVD) layer, a SiOF layer, a TEOS layer, and an HDP oxide layer formed using various deposition techniques as compared with an SiOCH layer which is a low dielectric constant layer.

FIG. 5 is a graph showing dielectric constants and elastic moduli of an FCVD layer, a SiOF (or FSG) layer, a TEOS (tetraethyl orthosilicate) layer, and an HDP (high-density plasma) oxide layer formed using the above-described deposition techniques as compared with the SiOCH layer having a low dielectric constant. Referring to FIG. 5, the FCVD layer, the SiOF layer, the TEOS layer, and the HDP oxide layer have larger dielectric constants than the SiOCH layer, but have higher elastic moduli than the SiOCH layer, and are thus more mechanically robust. Thus, the SiOCH layer is suitable as a first insulation layer material for use in a fast operation region, and the FCVD layer, the SiOF layer, the TEOS layer, or the HDP oxide layer may be applied to a second insulation layer material for use in a mechanically strengthened region. Although not illustrated but described above, an annealed layer obtained by annealing the SiOCH layer formed by FCVD may also be suitable as the second insulation layer material.

FIGS. 6A through 6E are cross-sectional views illustrating a method of fabricating an interlayer insulation layer DL3 having a composite structure in a semiconductor chip structure 400 according to some embodiments of the inventive subject matter. The embodiments illustrated in FIGS. 6A through 6E is different from the embodiments illustrated in FIGS. 4A through 4C in that a second insulation layer DL3b is induced from a part of a first insulation layer DL3a" having a low dielectric constant. A qualitative description about the fine structures of layers obtained according to a process sequence illustrated in FIGS. 6A through 6E will be made later with reference to FIGS. 7A through 7D.

Figure 6A:
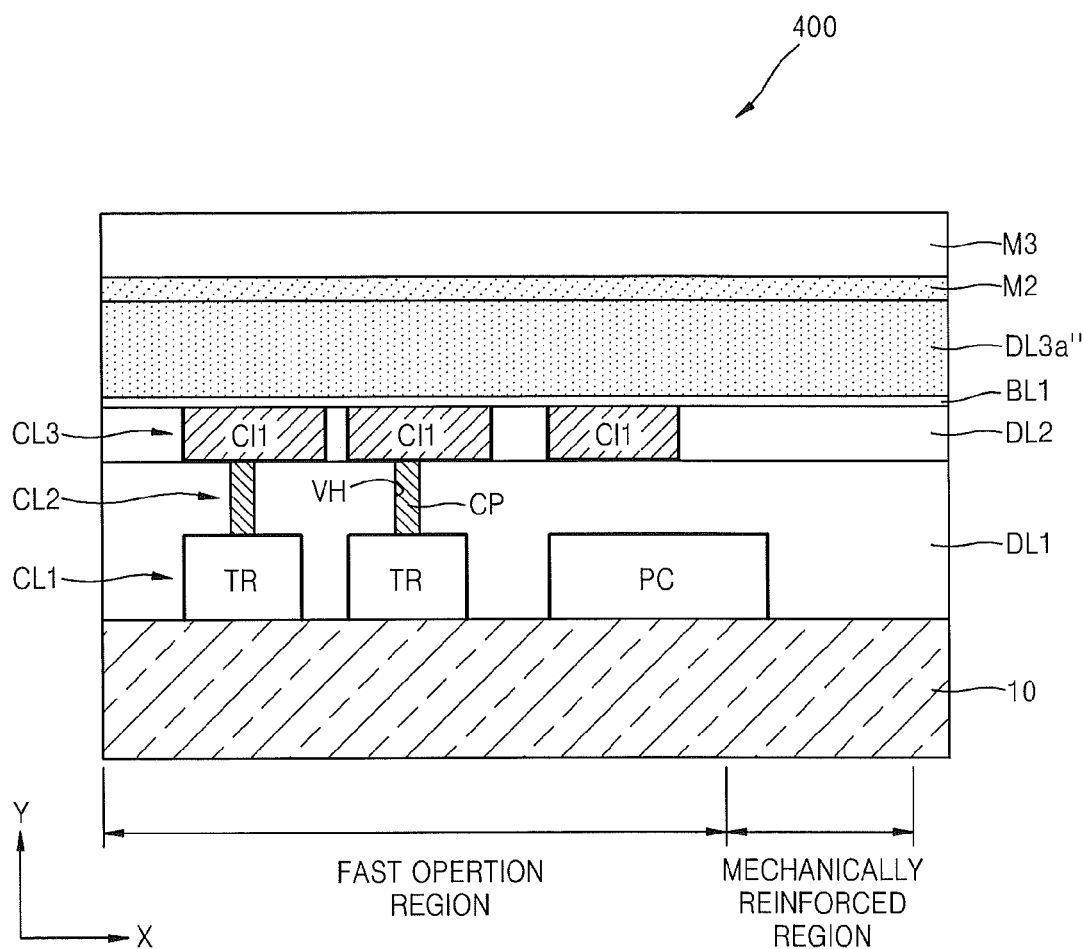
FIGS. 6A through 6E are cross-sectional views illustrating a method of fabricating an interlayer insulation layer having a composite structure in a semiconductor chip structure according to some embodiments of the inventive subject matter.

Referring to FIG. 6A, the first insulation layer DL3a" having a low dielectric constant is formed on a substrate 10 having a lower structure including a plurality of circuit layers CL1, CL2, and CL3 and interlayer insulation layers DL1 and DL2 for insulating the circuit layers CL1, CL2, and CL3 from each other, which are similar to what are illustrated in FIG. 4A.

The first insulation layer DL3a" having a low dielectric constant may be a silicon-based insulation layer, a porous silicon oxide layer, or a polymer insulation layer each including carbon (C), hydrogen (H), fluorine (F), or a combination of two or more of these materials. The first insulation layer DL3a" having a low dielectric constant may be the silicon-based insulation layer including carbon (C), hydrogen (H), fluorine (F), or a combination of two or more of these materials, for example, a SiOF layer, a SiOCF layer, or a SiOCH layer. The first insulation layer DL3a" having a low dielectric constant may be a SiOCH layer.

As described above, an SiOCH layer may be formed by PECVD using a gas mixture of trimethylsilane as a precursor and oxygen. By controlling a substrate temperature which is a process parameter, a fine structure, such as the porosity of the SiOCH layer, and/or a composition ratio may be changed, and thus a dielectric constant may be controlled to be less than or equal to 3. According to another embodiment of the inventive subject matter, the SiOCH layer may be formed by FCVD. The above-described formations of the first insulation layer DL3a" are just examples, and the inventive subject matter is not limited thereto.

A first mask layer M2 and a second mask layer M3 are sequentially formed on the first insulation layer DL3a". The first mask layer M2 acts as a hard mask layer and may be a silicon oxide layer or a silicon nitride layer, and the second mask layer M3 may be a photoresist layer.

Figure 6B:
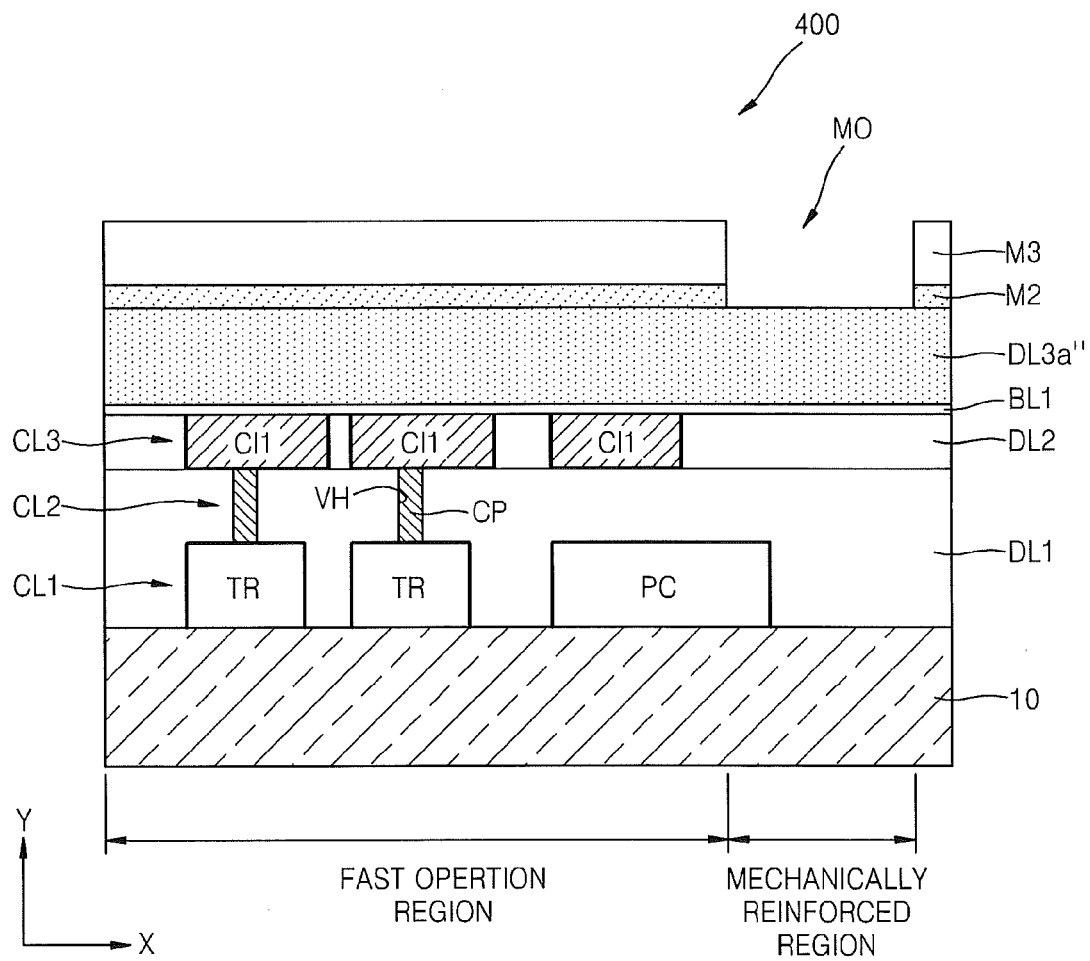

Referring to FIG. 6B, the second mask layer M3, which has an opening MO defining a mechanically strengthened region, is patterned to form a second mask pattern M3', and a first mask pattern M2' having an opening MO is formed using the second mask pattern M3' as an etch mask.

Figure 6C:
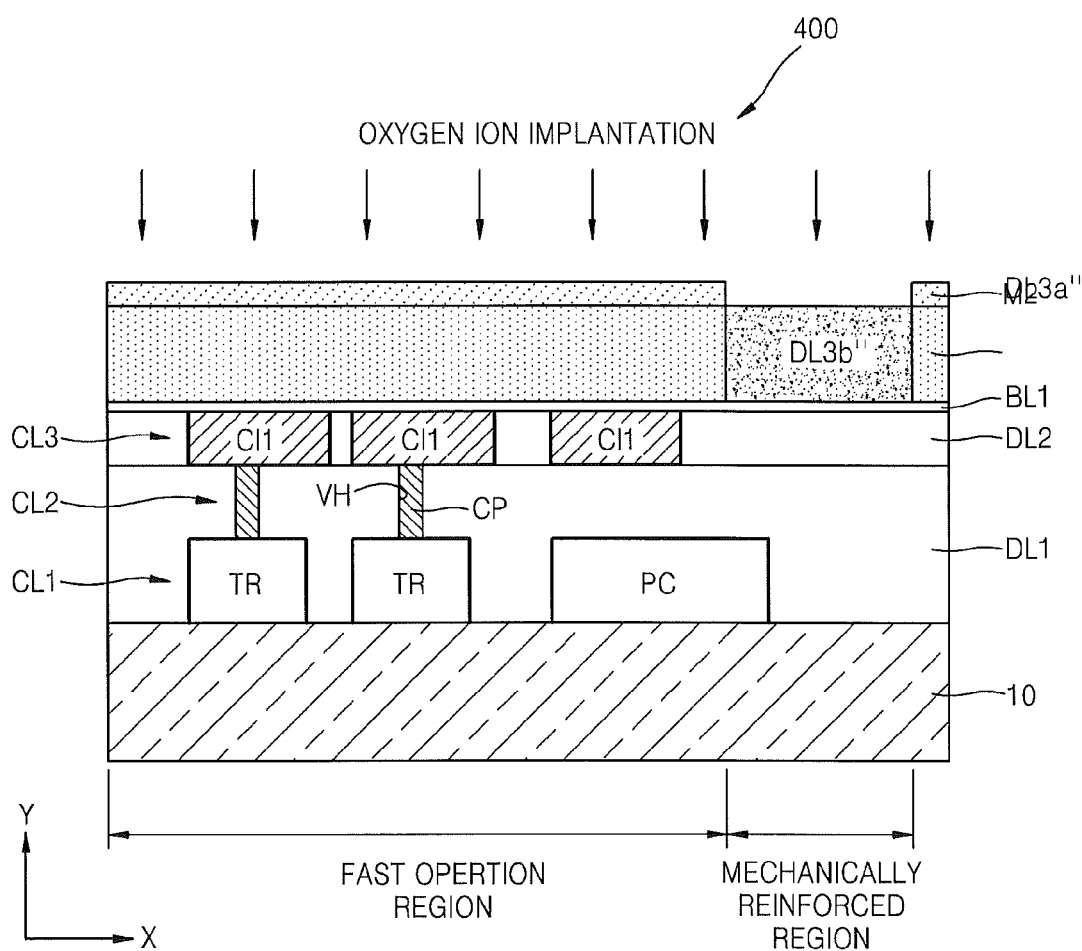

Referring to FIG. 6C, the second mask pattern M3' is removed, for example, by stripping the photoresist layer, so that only the first mask pattern M2' may remain on the substrate 10. Then, using the first mask pattern M2' as an ion implantation mask, oxygen ions are implanted into an exposed portion of the first insulation layer DL3a". Alternatively, the first insulation layer DL3a" may be exposed to plasma having plentiful oxygen radicals, as in an $O_2$ ashing process.

Through the oxygen ion implantation process or the $O_2$ ashing process, the concentration of oxygen atoms within the exposed portion of the first insulation layer DL3a" may be increased, and if the first insulation layer DL3a" includes carbon (C), hydrogen (H), fluorine (F), or a combination of two or more of these materials, the hydrogen (H) and/or fluorine (F) may be removed from the first insulation layer DL3a".

Figure 6D:
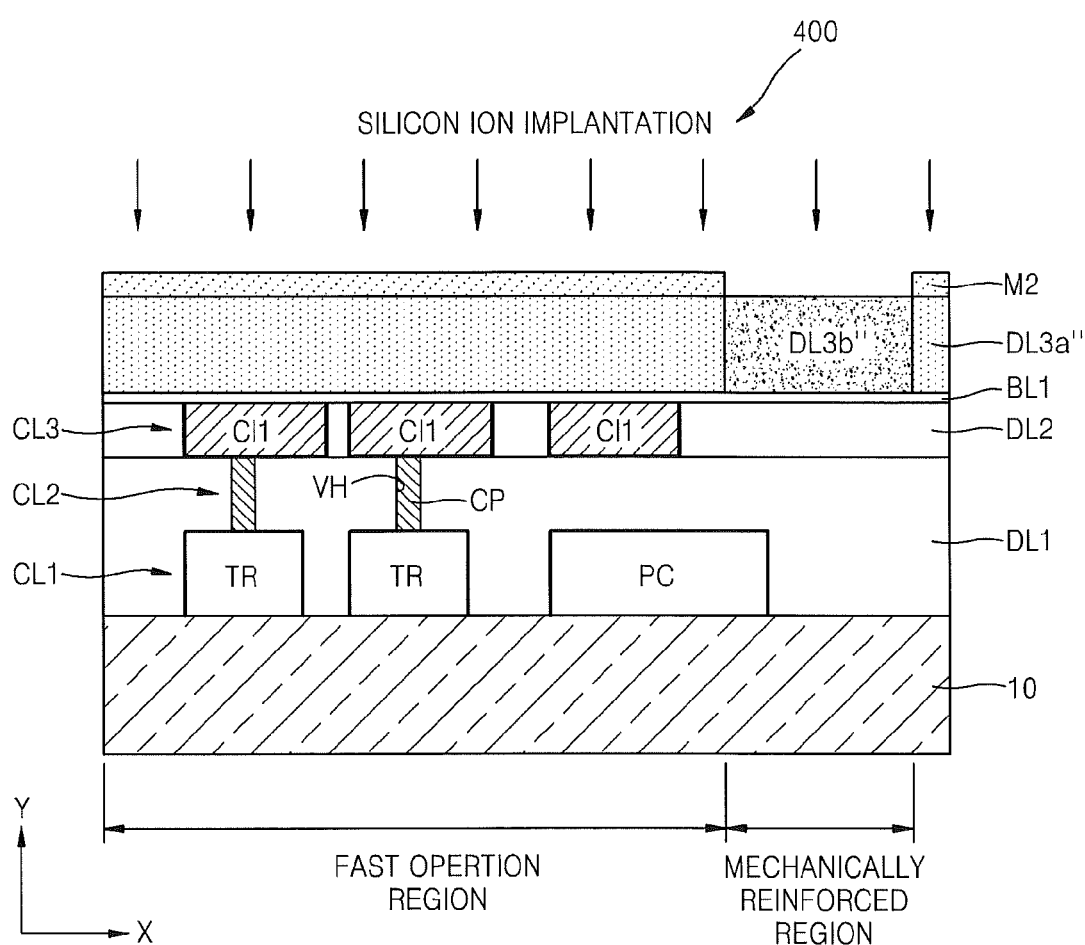
Figure 6E:
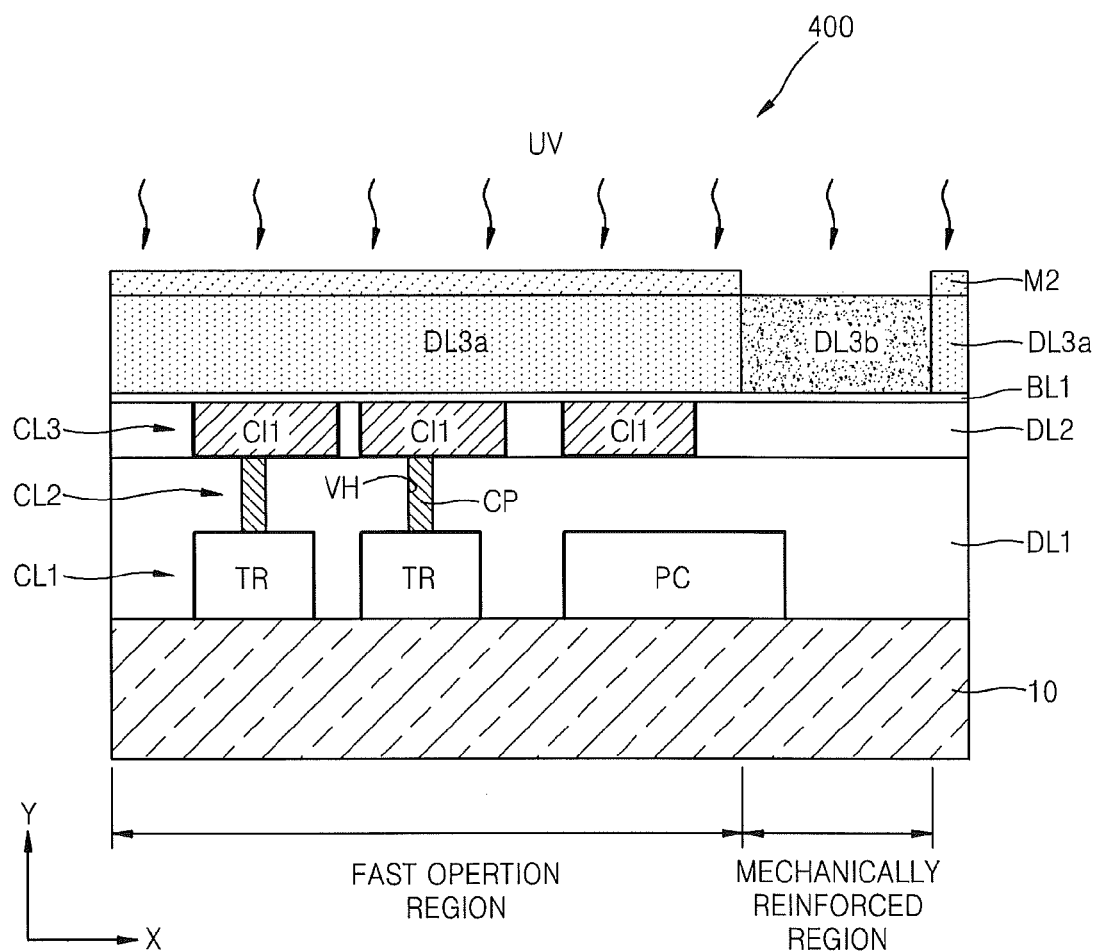

Referring to FIG. 6D, in some embodiments, silicon (Si) ions being a central element of a network structure within a silicon-based insulation layer may be implanted into the portion of the first insulation layer DL3a", into which oxygen ions have been implanted, by using the first mask pattern M2'. Alternatively, boron (B) ions or phosphorus (P) ions instead of or together with silicon (Si) ions may be implanted. The concentration of the implanted silicon (Si), boron (B) or phosphorus (P) ions may depend on the concentration of the implanted oxygen ions. For example, the concentration of the implanted silicon (Si), boron (B) or phosphorus (P) ions may be equal to or greater than the concentration of the implanted oxygen ions. According to the some embodiments, the second insulation layer DL3b formed from the first insulation layer DL3a" has a greater amount of silicon (Si) (or boron (B) or phosphorus (P)) than the first insulation layer DL3a".

Although silicon (Si) (or boron (B) or phosphorus (P)) implantation is performed after the oxygen ion implantation process or the $O_2$ ashing process in the above-described embodiment, the inventive subject matter is not limited thereto. For example, silicon (Si), boron (B) or phosphorus (P) ion implantation may be performed first, and the oxygen ion implantation process or the $O_2$ ashing process may be then performed.

Referring to FIG. 6E, the second insulation layer DL3b may become denser by annealing, for example, by thermal annealing. The annealing may be performed at a temperature in the range from about 350° C. to about 550° C. The annealing may be performed at a temperature in the range from about 350° C. to about 450° C. According to some embodiments, the annealing may be performed in an atmosphere including $N_2$, $H_2$, or a mixture of these materials. According to other embodiments, the annealing may be UV annealing or electronic beam annealing.

The annealing may be performed when the first mask pattern M2' remains. In this case, the first mask pattern M2' prevents H or C from out-gassing from the first insulation layer DL3a" and disappearing within the fast operation region during the annealing, thereby preserving the Si—$CH_3$ bonding within the first insulation layer DL3a" and thus maintaining a low dielectric constant suitable for the fast operation region.

FIGS. 7A through 7D illustrate models for explaining fine structures of layers obtained according to the processes of FIGS. 6A through 6E, to obtain qualitative understanding.

Figure 7A:
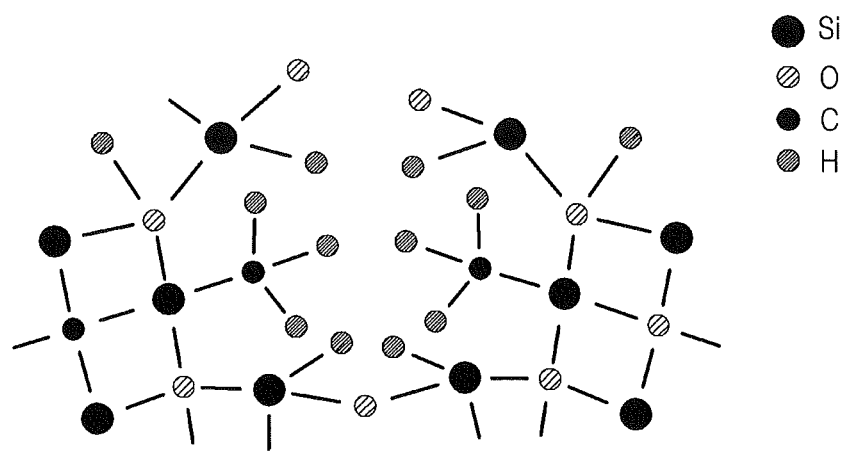
FIGS. 7A through 7D illustrate models for explaining fine structures of a layer obtained according to the processes of FIGS. 6A through 6E, to obtain qualitative understanding.

FIG. 7A illustrates a fine structure of the as-deposited first insulation layer DL3a" formed of a SiOCH layer illustrated in FIG. 6A. A part of the O—Si—O network is terminated by Si—-$CH_3$ bonding, and thus the structure of the O—Si—O network is destroyed. The Si—$CH_3$ bonding destroys a dense structure of a $SiO_2$ insulation layer to generate a fine structure having a very large porosity, so that the dielectric constant of the SiOCH layer may be reduced to less than the dielectric constant of the $SiO_2$ insulation layer. The increased Si—$CH_3$ bonding enables the first insulation layer DL3a" to be used as the first insulation layer DL3a having a low dielectric constant, which is included in the composite interlayer insulation layer DL3 having a composite structure.

Figure 7B:
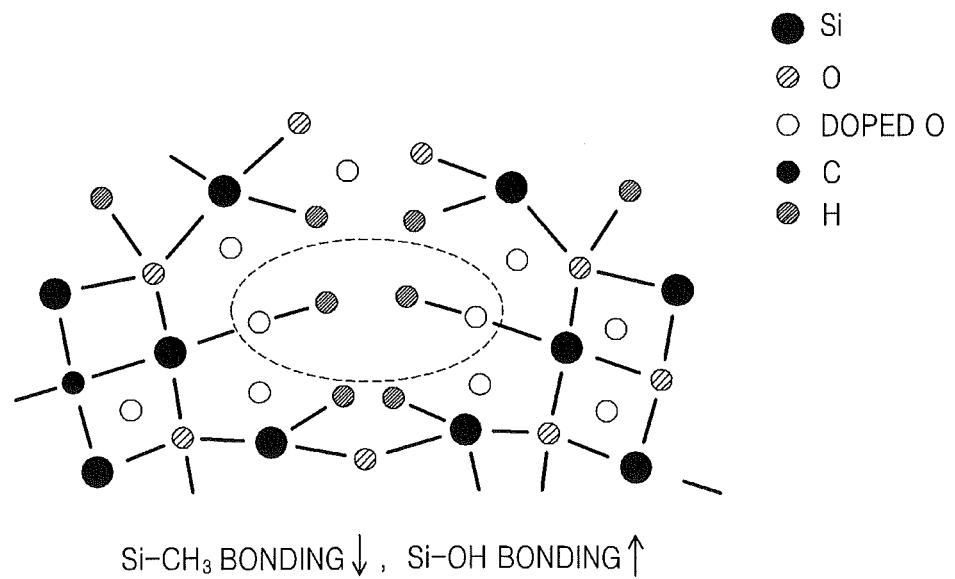

FIG. 7B illustrates a fine structure of a portion of the first insulation layer DL3a" existing within the mechanically strengthened region, which is exposed after the oxygen ion implantation process or the $O_2$ ashing process is performed using the first mask layer M2, as illustrated in FIG. 6C. Since the portion of the first insulation layer DL3a" existing within the mechanically strengthened region is oxidized by oxygen during the oxygen ion implantation process or the $O_2$ ashing process, the Si—$CH_3$ bonding is replaced by Si—OH bonding as indicated by a dotted circle.

Thus, in the portion of the first insulation layer DL3a" existing within the mechanically strengthened region, the number of Si—$CH_3$ bonds decreases, and the number of Si—OH bonding increases. Due to the increase in the hydrogen bonding within the first insulation layer DL3a", the mechanical strength of the first insulation layer DL3a" may be somewhat increased, and the dielectric constant thereof may also be increased.

Figure 7C:
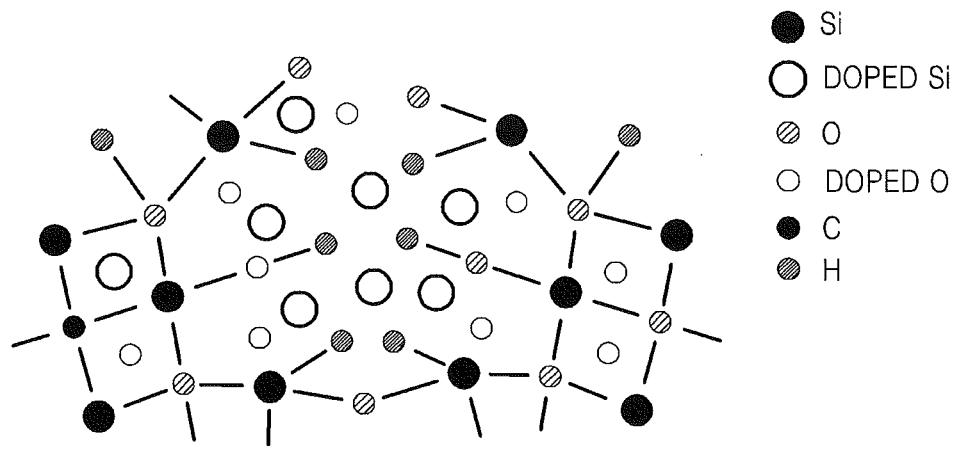

FIG. 7C illustrates a fine structure of a portion of the first insulation layer DL3a" existing within the mechanically strengthened region, which is exposed after the silicon ion implantation process is performed using the first mask layer M2, as illustrated in FIG. 6D. Doped Si atoms are inactivated and accommodated within the first insulation layer DL3a" without being bonded with oxygen atoms adjacent to the Si atoms. Even when B or P ions, which are a Group 3 or 5 elements, instead of the Si atoms are used, they behave in the same manner as the Si atoms.

Figure 7D:
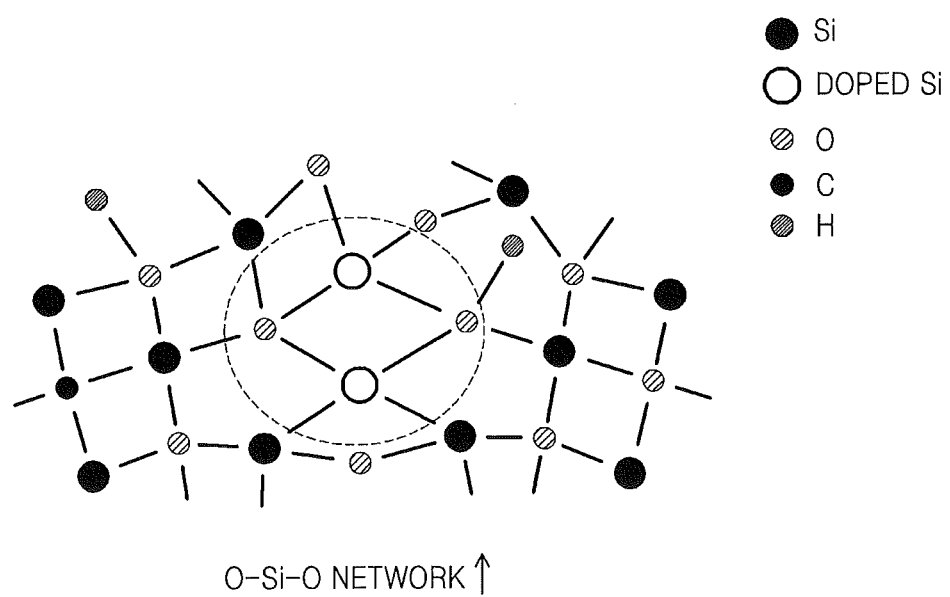

FIG. 7D illustrates a fine structure of a portion of the first insulation layer DL3a" existing within the mechanically strengthened region after annealing is performed, as illustrated in FIG. 6E. Si atoms doped by the annealing are activated and thus bonded with adjacent oxygen, and an O—Si—O network generated due to Si—O bonds is increased in the first insulation layer DL3a". Thus, the layer density of the portion of the first insulation layer DL3a" existing within the mechanically strengthened region is significantly increased, and the mechanical strength thereof is also increased.

Figure 8A:
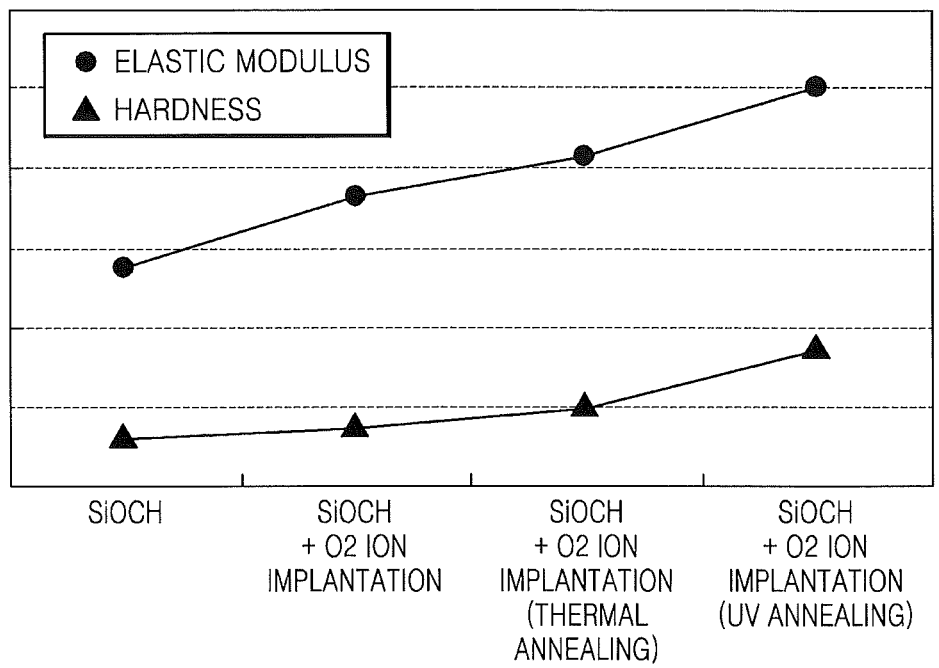
FIG. 8A is a graph showing the change in elastic modulus and hardness of an insulation layer with respect to oxygen ion implantation and annealing.
Figure 8B:
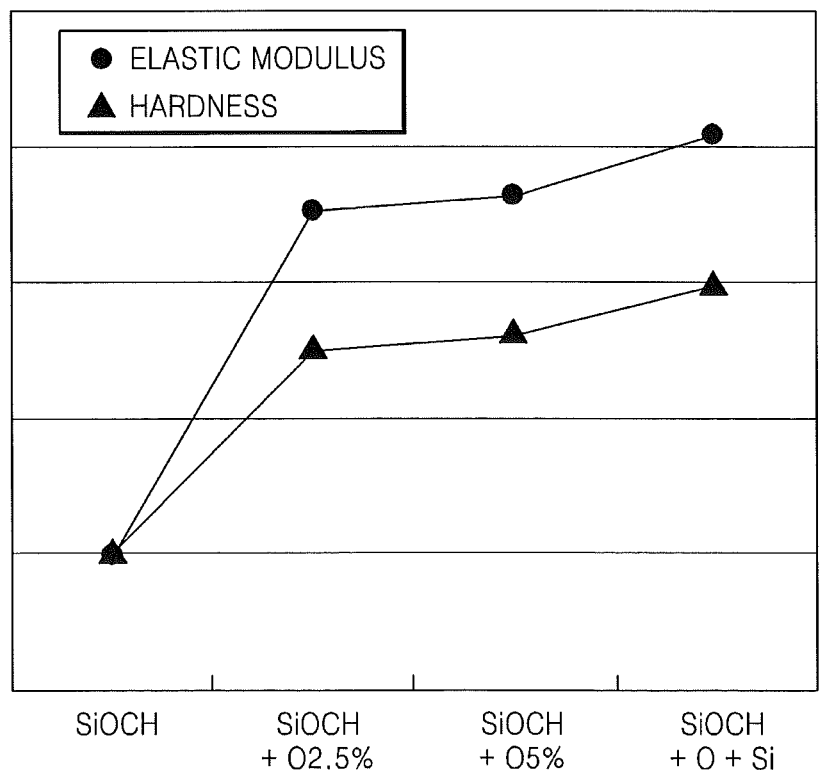
FIG. 8B is a graph showing the change in elastic modulus and hardness of an insulation layer when silicon ion implantation is further performed.

FIG. 8A is a graph showing the change in elastic modulus and hardness of a SiOCH insulation layer with respect to oxygen ion implantation and annealing. FIG. 8B is a graph showing the change in elastic modulus and hardness of the SiOCH insulation layer when silicon ion implantation is further performed.

Referring to FIG. 8A, the elastic modulus and hardness of the SiOCH insulation layer were increased 10% or greater due to oxygen ion implantation. When annealing was further performed, the mechanical characteristics of the SiOCH insulation layer were further improved. In particular, UV annealing was more advantageous than thermal annealing in improving the mechanical characteristics of the SiOCH insulation layer, because the UV annealing is more effective than the thermal annealing in transmitting the energy used to rearrange Si—O bonds and Si—CH$_3$ bonds.

Referring to FIG. 8B, the mechanical strength of the SiOCH insulation layer was improved by the oxygen ion implantation. When silicon ion implantation is further performed, the mechanical strength of the SiOCH insulation layer was further improved. The elastic modulus of the SiOCH insulation layer not subjected to the oxygen ion implantation was improved about 3 to 3.5 times after oxygen ions were implanted, and was improved about 4 times after silicon ions were further implanted.

According to some embodiments of the inventive subject matter, there is provided a semiconductor chip structure includes: circuit components disposed between a substrate and a passivation layer, for constituting a plurality of circuit layers; and a composite insulation layer comprising a first insulation layer having a low dielectric constant and a second insulation layer more mechanically strengthened than the first insulation layer, the composite insulation layer being disposed between the circuit components.

In some embodiments of the inventive subject matter, the second insulation layer may be selectively disposed adjacent to and on the same level as the first insulation layer so as to define a mechanically strengthened region within the semiconductor chip structure. The first insulation layer may include a recess or a through hole that defines the mechanically strengthened region. The second insulation layer may be buried in the recess or the through hole. The second insulation layer may be induced from a predetermined region of the first insulation layer that defines the mechanically strengthened region.

In some embodiments of the inventive subject matter, the first insulation layer may be a silicon oxide-based layer comprising carbon (C), hydrogen (H), fluorine (F) or a combination of two or more of these materials. An oxygen concentration of the second insulation layer may be greater than an oxygen concentration of the first insulation layer. A silicon concentration of the second insulation layer may be greater than a silicon concentration of the first insulation layer.

In some embodiments of the inventive subject matter, the first insulation layer may be a SiOCH layer. Bonding density between oxygen atoms and silicon atoms in the second insulation layer is greater than that in the first insulation layer. The second insulation layer may include a silicon oxide layer or a silicon nitride layer. The second insulation layer may include a flowable chemical vapor deposition layer.

In some embodiments of the inventive subject matter, the circuit components may include conductive fuses. The second insulation layer may be disposed below the conductive fuses. In some embodiments of the inventive subject matter, the circuit components may further include conductive lines. The first insulation layer may be disposed below the conductive lines. The conductive fuses may have damascene structures of copper or copper alloy in which the copper or a copper alloy is buried in trenches of the second insulation layer. The circuit components may further include conductive lines having damascene structures of copper or copper alloy in which the copper or a copper alloy is buried in trenches of the first insulation layer.

In some embodiments of the inventive subject matter, the semiconductor chip structure may further include a copper diffusion preventing layer between inner walls of the trenches of the first insulation layer and the damascene structures of copper or copper alloy.

In some embodiments of the inventive subject matter, the circuit components may include conductive pads for electrical connection with an external circuit. The second insulation layer may be disposed under the conductive pads.

In some embodiments of the inventive subject matter, the second insulation layer may be disposed on an edge of the semiconductor chip structure that is defined by a scribe line.

According to an aspect of the inventive subject matter, there is provided a semiconductor chip structure including: circuit components disposed between a substrate and a passivation layer, for constituting a plurality of circuit layers; and a composite insulation layer comprising a first insulation layer having a low dielectric constant and a second insulation layer more mechanically strengthened than the first insulation layer, the composite insulation layer being disposed between the circuit components. The first insulation layer may be a silicon oxide-based layer including carbon (C), hydrogen (H), fluorine (F), or a combination of two or more of these materials.

In some embodiments of the inventive subject matter, a silicon concentration of the second insulation layer may be greater than a silicon concentration of the first insulation layer.

In some embodiments of the inventive subject matter, the semiconductor chip structure may further includes a buffer layer disposed above or below the composite insulation layer.

In some embodiments of the inventive subject matter, the buffer layer may include a SiN layer, a SiCN layer, or a combination of the SiN layer and the SiCN layer.

According to another aspect of the inventive subject matter, there is provided a method of fabricating a semiconductor chip structure, the semiconductor chip structure including a plurality of circuit layers each including circuit components; and a composite insulation layer comprising a first insulation layer having a low dielectric constant and a second insulation layer more mechanically strengthened than the first insulation layer, the composite insulation layer disposed between at least two of the plurality of circuit layers. The method includes an operation of forming the second insulation layer selectively disposed adjacent to the first insulation layer so as to define a mechanically strengthened region within the semiconductor chip structure.

In some embodiments of the inventive subject matter, the operation of forming the second insulation layer includes forming a first insulation layer having a low dielectric constant, forming a recess or a through hole defining the mechanically strengthened region, forming a second insulation layer more mechanically strengthened than the first insulation layer on the first insulation layer so as to fill the recess or the through hole, and defining the first and second insulation layers by planarizing the second insulation layer so that the surface of the first insulation layer is exposed.

The forming of the second insulation layer is performed by flowable chemical vapor deposition (FCVD). The forming of the second insulation layer may be performed by thermal chemical vapor deposition (thermal CVD), plasma enhanced CVD (PECVD), or a spin-on-glass (SOG) process.

The operation of forming the second insulation layer includes forming a first insulation layer having a low dielectric constant; and selectively changing a fine structure of a predetermined region of the first insulation layer that is to serve as a mechanically strengthened region, so as to define the first and second insulation layers.

The selective changing of the fine structure of the predetermined region may include forming a mask layer exposing the predetermined region on the first insulation layer; and performing oxygen ion implantation or oxygen ashing on the exposed predetermined region of the first insulation layer.

In some embodiments of the inventive subject matter, after the performing of the oxygen ion implantation or the oxygen ashing, silicon ion implantation or Group III or Group V element ion implantation may be further performed on the exposed predetermined region of the first insulation layer. After the performing of the oxygen ion implantation or the oxygen ashing, thermal or UV annealing may also be further performed.

In some embodiments of the inventive subject matter, the first insulation layer is a silicon oxide-based layer comprising carbon (C), hydrogen (H), fluorine (F), or a combination of two or more of these materials, and an oxygen concentration of the second insulation layer is greater than an oxygen concentration of the first insulation layer.

In some embodiments of the inventive subject matter, the first insulation layer is a silicon oxide-based layer comprising carbon (C), hydrogen (H), fluorine (F), or a combination of two or more of these materials, and a silicon concentration of the second insulation layer may be greater than a silicon concentration of the first insulation layer. The silicon oxide-based layer may include a SiOCH layer.

A first circuit layer from among the plurality of circuit layers may include conductive fuses. The method may further include an operation of forming the conductive fuses on the second insulation layer, after an operation of forming the composite insulation layer. The conductive fuses may each include a damascene structure buried in the second insulation layer. The first circuit layer further includes conductive lines each having a damascene structure. The method may further include an operation of forming the conductive lines in the first insulation layer. The operation of forming the conductive fuses on the second insulation layer is performed simultaneously with the operation of forming the conductive lines in the first insulation layer.

The first circuit layer may include conductive pads for electrical connection with an external circuit. The method may further include an operation of forming the conductive pads on the second insulation layer.

The method may further include an operation of individualizing the semiconductor chip structure along a scribe line defined on the second insulation layer.

The foregoing is illustrative of exemplary embodiments and is not to be construed as limiting thereof. Although exemplary embodiments have been described, those of ordinary skill in the art will readily appreciate that many modifications are possible in the exemplary embodiments without materially departing from the novel teachings and advantages of the exemplary embodiments. Accordingly, all such modifications are intended to be included within the scope of the claims. Exemplary embodiments are defined by the following claims, with equivalents of the claims to be included therein.

What is claimed is:

1. An integrated circuit device comprising:
a plurality of stacked circuit layers, at least one of the plurality of circuit layers comprising a composite interlayer insulation layer comprising laterally adjacent first and second insulating material regions having different mechanical strengths and dielectric properties and a plurality of circuit components disposed in the composite interlayer insulation layer.

2. The device of claim 1, wherein the first insulating material region has a lower dielectric constant and a lower mechanical strength than the second insulating material region.

3. The device of claim 2, wherein the first insulating material region has a lower dielectric constant and a lower elastic modulus and/or hardness than the second insulating material region.

4. The device of claim 2, wherein the second insulating material region is positioned proximate a location of the device that is susceptible to a localized mechanical stress.

5. The device of claim 4, wherein the second insulating material region is positioned proximate a fuse location, an external connection bonding location and/or scribe line location.

6. The device of claim 2, wherein the composite interlayer insulation layer comprises a continuous insulating material layer and wherein the second insulating material comprises a doped region in the continuous insulating material layer.

7. The device of claim 6, wherein the second insulating material region comprises doped SiOCH.

8. The device of claim 2, wherein the first and second material regions comprise distinct separately-deposited insulating material regions.

9. The device of claim 8, wherein the first insulating material region comprises SiOCH and wherein the second insulating material region comprises SiO2, SiON and/or SiN.

10. The device of claim 2, wherein the first insulating material region comprises a first silicon oxide material comprising carbon (C), hydrogen (H) and/or fluorine (F).

11. The device of claim 2, wherein the first and second insulating material region comprise respective first and second silicon oxide materials and wherein an oxygen concentration of the second insulating material region is greater than an oxygen concentration of the first insulating material region.

12. The device of claim 2, wherein the first and second insulating material region comprise respective first and second silicon oxide materials and wherein a silicon concentration of the second insulating material region is greater than a silicon concentration of the first insulating material region.

13. The device of claim 1, wherein the plurality of stacked layers comprises two or more composite interlayer insulation layers, each comprising laterally adjacent first and second insulating material regions having different mechanical strengths and dielectric properties and wherein the plurality of circuit components comprises circuit components disposed in the two or more composite interlayer insulation layers.

14. The device of claim 1, further comprising a buffer layer disposed above or below the composite insulation layer.

15. An integrated circuit device comprising:
a plurality of stacked circuit layers, at least one of the plurality of circuit layers comprising a composite interlayer insulation layer comprising laterally adjacent first and second insulating material regions comprising respective first and second silicon-containing insulating materials and a plurality of circuit components disposed in the composite interlayer insulation layer, wherein the second silicon-containing insulating material has a greater silicon concentration than the first silicon-containing insulating material.

16. The device of claim 15, wherein the first insulating material region has a lower dielectric constant and a lower mechanical strength than the second insulating material region.

17. The device of claim 16, wherein the first insulating material region has a lower dielectric constant and a lower elastic modulus and/or hardness than the second insulating material region.

18. The device of claim 15, wherein the first insulating material region comprises a silicon oxide-based layer comprising carbon (C), hydrogen (H) and/or fluorine (F).

19. The device of claim 15, further comprising a buffer layer disposed above or below the composite insulation layer.

20. The device of claim 15, wherein the second insulating material region is positioned proximate a location of the device that is susceptible to a localized mechanical stress.

* * * * *